United States Patent
Salimath et al.

(10) Patent No.: US 11,967,350 B1
(45) Date of Patent: Apr. 23, 2024

(54) SYSTEM AND METHOD FOR CURRENT CONTROLLED NANOWIRE MEMORY DEVICE

(71) Applicant: Ceremorphic, Inc., San Jose, CA (US)

(72) Inventors: Akshaykumar Salimath, Hyderabad (IN); Venkat Mattela, San Jose, CA (US); Sanghamitra Debroy, Hyderabad (IN)

(73) Assignee: Ceremorphic,inc., San Jose, CA (US)

(*) Notice: Subject to any disclaimer, the term of this patent is extended or adjusted under 35 U.S.C. 154(b) by 146 days.

(21) Appl. No.: 17/589,739

(22) Filed: Jan. 31, 2022

(51) Int. Cl.
| | | |
|---|---|---|
| *G11C 11/00* | (2006.01) | |
| *G11C 11/16* | (2006.01) | |
| *H10B 61/00* | (2023.01) | |
| *H10N 50/10* | (2023.01) | |
| *H10N 52/00* | (2023.01) | |
| *H10N 52/80* | (2023.01) | |

(52) U.S. Cl.
CPC .......... *G11C 11/1673* (2013.01); *H10B 61/00* (2023.02); *H10N 50/10* (2023.02); *H10N 52/101* (2023.02); *H10N 52/80* (2023.02)

(58) Field of Classification Search
CPC ...... H10B 61/00; H10N 52/101; H10N 50/10; H10N 52/80; G11C 11/1673
USPC ........................................................ 365/158
See application file for complete search history.

(56) References Cited

U.S. PATENT DOCUMENTS 9,196,280 B2* 11/2015 Kunz ................. G11C 19/0816
9,276,196 B2*  3/2016 Allenspach ........ G11C 19/0808
9,431,599 B2*  8/2016 Lew .................... H10N 50/80
9,500,519 B2* 11/2016 Tang ..................... G01J 1/0425
10,781,534 B2*  9/2020 Hyot ..................... C30B 29/40

FOREIGN PATENT DOCUMENTS

GB          2452474 A  *  3/2009 ............. B82Y 25/00

OTHER PUBLICATIONS

Jose A. Fernandez, "Electric current & Field Control of Vortex structures in cylindrical magnetic nanowires", Jul. 2007, Physical Review B, 102, 024421, pp. 1-6 (Year: 2007).*
Mohamed Al Bahri et al, "Vortex Domain Wall Thermal Stability in Magnetic Nano devices with in-plane magnetic anisotropy", Research Article, www.pss-a.com, 2022 Wiley, 2200596, pp. 1-8. (Year: 2022).*
Marek Vanatka et al, "Magnetic Vortex nucleation modes in static magnetic fields", AIP Advances 7, 105103, 2017, pp. 1-8 (Year: 2017).*
M. T. Bryan et al, "Transverse Field-induced Nucleation Pad Switching Modes during domain wall injection", center for NanoScience & Technology, University of Sheffield, UK, IEEE Explore, Nov. 2009, vol. 46, Issues 4 (Year: 2009).*

* cited by examiner

*Primary Examiner* — Viet Q Nguyen
(74) *Attorney, Agent, or Firm* — Minisandram Law Firm; Raghunath S. Minisandram (57) ABSTRACT

A system and method for a memory device is disclosed. A substrate is provided. A nucleation pad is disposed over the substrate. A nanowire is disposed substantially perpendicular, about a center of the nucleation pad. A charge current is selectively passed through the substrate to nucleate a magnetic vortex in the nucleation pad, the magnetic vortex indicative of a magnetic domain and a direction of the magnetic vortex indicative of a polarity of the magnetic domain. A shift current is applied through the nanowire to shift the magnetic domain into the nanowire.

12 Claims, 5 Drawing Sheets

SYSTEM AND METHOD FOR CURRENT CONTROLLED NANOWIRE MEMORY DEVICE

RELATED APPLICATION

None

TECHNICAL FIELD

The present invention relates generally to memory devices and more specifically, to current controlled nanowire storage device.

DESCRIPTION OF RELATED ART

The rapid development of data storage technology has ensured a continuous increase of the memory density over the past years. However, within the existing two-dimensional (2D) device paradigm the theoretical density limit is almost reached. A further increase in memory capacity can only be accomplished through novel approaches. One possible solution could be a utilization of the third dimension by increasing the number of layers in which the bits are stored, for example, a three-dimensional (3D) device.

Further, continued requirement for minimal power consumption in computing devices configured to use these devices and utilization of semiconductor technology to construct these devices are desirable for mass adaptation of these devices. With these needs in mind, the current disclosure arises. This brief summary has been provided so that the nature of the disclosure may be understood quickly. A more complete understanding of the disclosure can be obtained by reference to the following detailed description of the various embodiments thereof in connection with the attached drawings.

SUMMARY OF THE INVENTION

In one embodiment, a method is disclosed. A substrate is provided. A nucleation pad is disposed over the substrate. A nanowire is disposed substantially perpendicular, about a center of the nucleation pad. A charge current is selectively passed through the substrate to nucleate a magnetic vortex in the nucleation pad, the magnetic vortex indicative of a magnetic domain and a direction of the magnetic vortex indicative of a polarity of the magnetic domain.

In another embodiment, a system is disclosed. A substrate is provided. A nucleation pad is disposed over the substrate. A nanowire is disposed substantially perpendicular, about a center of the nucleation pad. A charge current is selectively passed through the substrate to nucleate a magnetic vortex in the nucleation pad, the magnetic vortex indicative of a magnetic domain and a direction of the magnetic vortex indicative of a polarity of the magnetic domain.

This brief summary is provided so that the nature of the disclosure may be understood quickly. A more complete understanding of the disclosure can be obtained by reference to the following detailed description of the preferred embodiments thereof in connection with the attached drawings.

BRIEF DESCRIPTION OF THE DRAWINGS

The foregoing and other features of several embodiments are described with reference to the drawings. In the drawings, the same components have the same reference numerals. The illustrated embodiments are intended to illustrate but not limit the invention. The drawings include the following figures.

DETAILED DESCRIPTION

To facilitate an understanding of the adaptive aspects of the present disclosure, an example memory device will be described. The specific construction and operation of the adaptive aspects of various elements of the example memory device is described.

Figure 1:
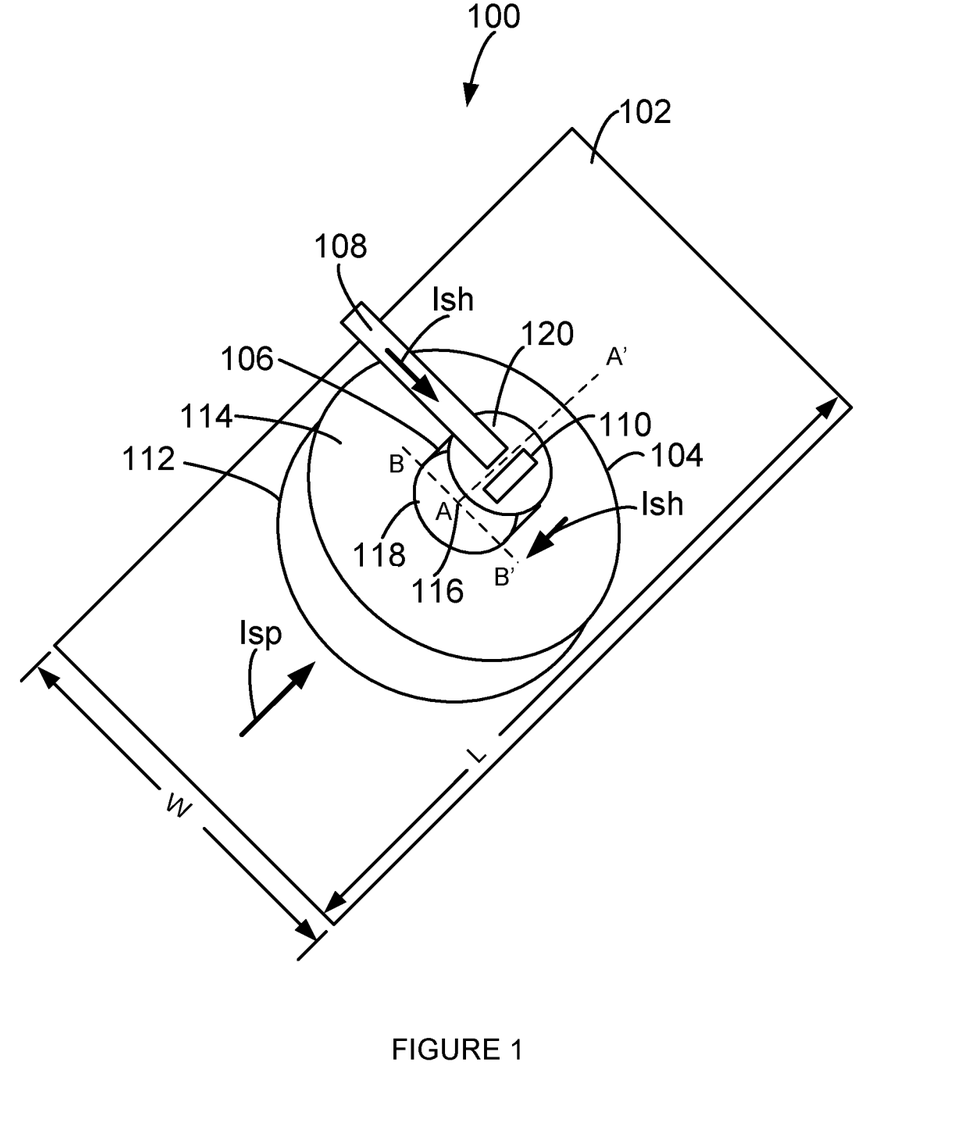
FIG. 1 shows an example memory device, according to one aspect of the present disclosure.

FIG. 1 shows an example memory device 100. The memory device 100 includes a substrate 102, a nucleation pad 104, a nanowire segment 106, a shift electrode 108 and a sensor 110. The substrate 102 is a conductive metal layer. The substrate 102 is substantially made of heavy metal, such as Tantalum (Ta), Platinum (Pt), or Tungsten (W) or an alloy of heavy metal. In one example, the substrate 102 is a layer of thin film with a very large spin hall angle, such as a layer of thin film of Tantalum (Ta), Platinum (Pt), or Tungsten (W) or an alloy of Tantalum (Ta), Platinum (Pt), or Tungsten (W). The substrate 102 is configured to receive a charge current and convert the charge current into a spin current, through spin Hall effect. The thickness of the substrate 102 may be of the order of about 5 nm to about 10 nm. Although, the substrate 102 is shown to be at least as large as the nucleation pad 104, the substrate 102 need not be as large as the nucleation pad 104, but at least large enough to provide sufficient spin current through spin Hall effect. In some examples, the substrate 102 extends beyond the nucleation pad 104. As an example, the length L of the substrate 102 may be larger than a diameter of the nucleation pad 104. In some examples, the width W of the substrate 102 may be equal to or larger than the diameter of the nucleation pad 104. As one skilled in the art appreciates, the substrate 102 may be deposited on a base layer (not shown). In some examples, base layer may be a silicon wafer.

The nucleation pad 104 is substantially made of a permalloy. In some examples, a suitable cobalt-nickel alloy or other similar materials that provide high magnetic permeability may be used. In one example, the nucleation pad 104 is substantially cylindrical, with a diameter of about 300 nm to about 500 nm. The thickness of the nucleation pad 104 may be of the order of about 5 nm to about 10 nm. The nucleation pad 104 has a first end 112 abutting the substrate 102 and a second end 114 opposite to the first end 112, away from the substrate 102. In some examples, the nucleation pad 104 is made of substantially similar material as the nanowire 106.

As previously described, the substrate 102 is configured to receive a charge current. When a charge current Isp is passed through the substrate 102, the spin current (due to spin Hall effect) at the interface between the substrate 102 and the nucleation pad 104 nucleate a magnetic vortex. In one example, the magnetic vortex is nucleated between the first end 112 and second end 114 of the nucleation pad 104. In one example, the domain wall nucleation and switching is established at the nucleation pad 104 which is in contact with the substrate 102, through the mechanism of spin Hall effect. The function and feature of the magnetic vortex will be later described in detail.

A nanowire segment 106 is disposed over the nucleation pad 104, about the second end 114 of the nucleation pad 104. The nanowire segment 106 in one example is deposited about a center 116 of the nucleation pad 104. The nanowire segment 106 is deposited about an axis A-A' that is substantially perpendicular to the plane B-B' of the nucleation pad 104. The nanowire segment 106 includes a first end 118 and a second end 120. The nanowire segment 106 is substantially made of a permalloy. In some examples, a suitable cobalt-nickel alloy or other similar materials that provide high magnetic permeability may be used. The nanowire segment 106 in one example, is substantially cylindrical. The diameter of the nanowire segment 106 may be about 80 nm to about 120 nanometer. A thickness of the nanowire segment 106 may be of the order of about 400 nm to about 700 nm. In one example, the nanowire segment 106 is deposited using Aluminum Oxide templates (AOT).

The shift electrode 108 is disposed over the second end 120 of the nanowire segment 106. The shift electrode 108 is electrically coupled to the nanowire segment 106 and configured to pass a shift current Ish through the nanowire segment 106, along the axis A-A'. In one example, the shift current Ish is passed from the second end 120 of the nanowire segment 106 to the first end 118 of the nanowire segment 106. This causes the domain wall formed in the nucleation pad 104 about the second end 114 of the nucleation pad 104 to shift up into the nanowire segment 106. For example, the domain wall shifts from about the first end 118 of the nanowire segment 106 to the second end 120 of the nanowire segment 106. In one example, the domain wall shifting will occur due to spin transfer torque (STT). Function and features of selectively shifting the domain wall through the nanowire segment 106 will be later described in detail.

The sensor 110 is operatively disposed about the nanowire segment 106, so as to read the magnetic characteristics of the nanowire segment 106. For example, the sensor 110 is operatively disposed about the nanowire segment 106 to read the magnetic state of the nanowire segment 106. In one example, the sensor 110 is operatively disposed about the second surface 120 of the nanowire segment 106, to selectively read the magnetic characteristics of the nanowire segment 106. In one example, the sensor may be a magneto-resistive sensor, whose resistance changes based upon the magnetic characteristics of the nanowire segment 106. For example, a giant magneto-resistive sensor (sometimes referred to as GMR sensor) or a tunneling magneto-resistance sensor (sometimes referred to as TMR sensor) may be used. Although the position of the sensor 110 is described to be about the second end of the nanowire segment 106, in some examples, the sensor 110 may be positioned about the side surface of the nanowire segment 106, for example, between the first end 118 and second end 120 of the nanowire segment 106.

Figure 1A:
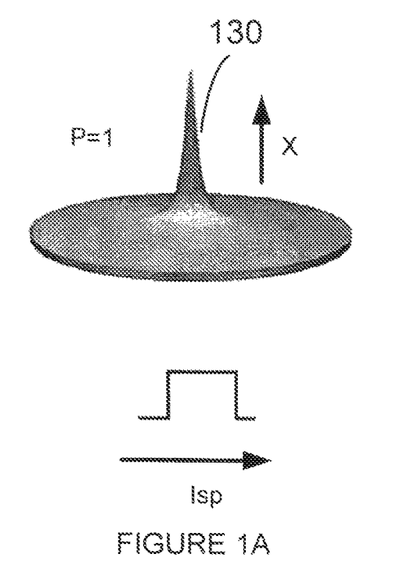
FIGS. 1A and 1B show an example of magnetic vortex created in the memory device, according to one aspect of the present disclosure.
Figure 1B:
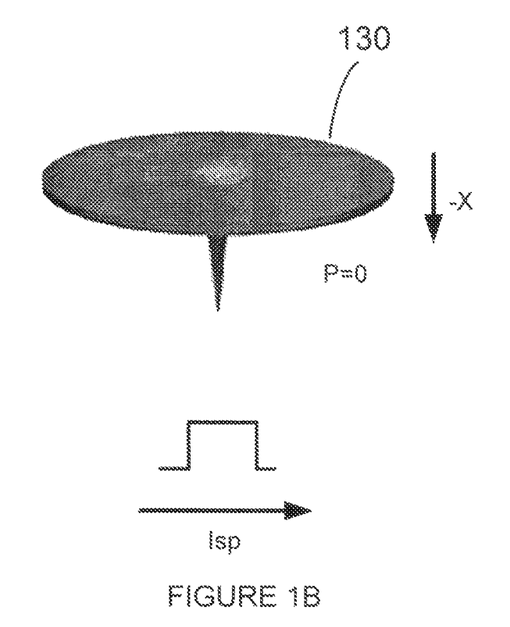

Now, referring to FIGS. 1A and 1B, example formation of the magnetic domain due to magnetic vortex formed in the nucleation pad 104 is shown. between the substrate 102 and nucleation pad 104 is shown. Now, referring to FIG. 1A, we notice that when a charge current pulse Isp is passed through the substrate 102, a magnetic vortex is formed. In this example, the magnetic vortex is extending from the first end 112 of the substrate 102 towards the second end 114 of the substrate 102, in the direction X. In this example, the direction X of the magnetic vortex is considered to indicate a magnetic domain with a positive value or a value of 1. Now, referring to FIG. 1B, another charge current pulse Isp is passed through the substrate 102, which switches the direction of the magnetic vortex to direction −X. In this example, the magnetic vortex is extending from the second end 114 of the substrate 102 towards the first end 112 of the substrate 102, in the direction −X. In this example, the direction −X of the magnetic vortex is considered to indicate a magnetic domain with a value of 0. As one skilled in the art appreciates, successive charge current Isp pulses will switch the direction of the magnetic vortex, within the nucleation pad 104, about the interface between the substrate 102 and the nucleation pad 104. This will create magnetic domain with values switching between a 0 and a 1, based on the direction of the magnetic vortex. In one example, the charge current Isp pulse is of the order of about 5 mA to 10 mA. The pulse width of the charge current Isp is of the order of about 0.2 nanoseconds to about 0.5 nanoseconds.

Figure 1C:
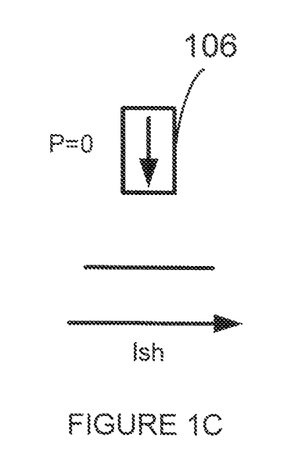
FIGS. 1C and 1D show an example of shifting of the magnetic domain into a nanowire segment of the memory device, according to one aspect of the present disclosure.
Figure 1D:
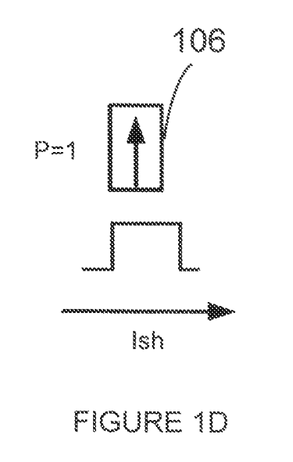

Now, referring to FIGS. 1C and 1D, shifting of the magnetic domain value from the nucleation pad 104 to the nanowire segment 106 is described. Now, referring to FIG. 1C, a polarity P of the nanowire segment 106 is shown to be 0. In one example, the polarity of the nanowire segment 106 is initialized to be 0. Now, referring to FIG. 1D, a shift current Ish pulse is passed through the nanowire segment 106. As previously described, the shift current Ish pulse is passed through the nanowire segment 106 from the second end 120 to the first end 118 of the nanowire segment 106. In one example, the shift current Ish is about 75 mA to about 100 mA. The pulse width of the shift current Ish is of the order of about 10 nanoseconds to about 30 nanoseconds.

When the shift current Ish is passed through the nanowire segment 106, the domain wall currently positioned about the interface between the nucleation pad 104 and the nanowire segment 106 moves up into the nanowire segment 106. For example, the domain wall moves up to the second end 120 of the nanowire segment 106. Therefore, the magnetic domain value corresponding to the magnetic vortex formed in the nucleation pad 104 is shifted into the nanowire segment 106. And, the polarity of the magnetic domain in the nanowire segment 106 will be the same as the polarity of the magnetic domain in the nucleation pad 104. For example, as the direction of the magnetic vortex in the nucleation pad 104 was indicative of a positive value of P=1, the polarity of the magnetic domain in the nanowire segment 106 will switch to a value of 1.

If on the other hand, the polarity of the magnetic domain due to magnetic vortex in the nucleation pad 104 was indicative of a value of P=0, and the polarity of the magnetic domain in the nanowire segment 106 had a value of P=1, upon passing of the shift current Ish pulse, the polarity of the magnetic domain in the nanowire segment 106 will be switched to represent the polarity of the magnetic domain in the nucleation pad 104, which in this case will indicate a magnetic domain value of P=0.

As previously described, the sensor 110 may be selectively used to measure the polarity of the magnetic domain so as to determine the value of P, which is indicative of the state of the nanowire segment 106. For example, a GMR or a TMR sensor operatively disposed adjacent the nanowire segment 106 may be selectively used to measure the magnetic domain value.

Having described a memory device 100 with a single nanowire segment 106 whose magnetic domain state may be selectively switched between a value of P=0 and P=1, another example memory device 100A with a plurality of nanowire segments is described with reference to FIG. 2.

Figure 2:
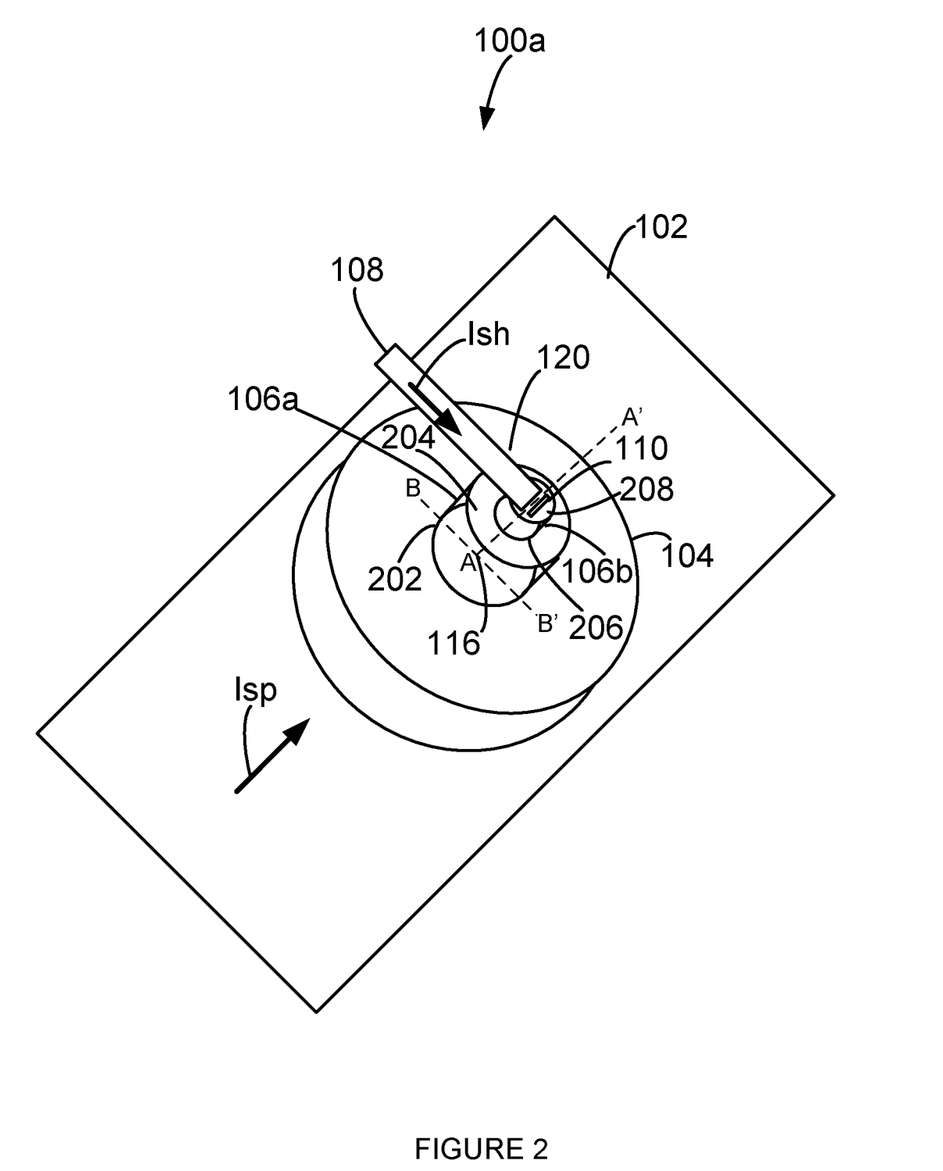
FIG. 2 shows another example of the memory device with a plurality of nanowire segments, according to one aspect of the present disclosure.

Now referring to FIG. 2, another memory device 100A is described. The memory device 100A is similar to memory device 100 previously described with reference to FIG. 1 in that the memory device 100A includes a substrate 102, a nucleation pad 104, a shift electrode 108, and a sensor 110. However, in this example, instead of a single nanowire segment 106 of memory device 100, the memory device 100A includes a plurality of nanowire segments. For example, the memory device 100A includes a first nanowire segment 106a and a second nanowire segment 106b. The first nanowire segment 106a is disposed about a center 116 of the nucleation pad 104.

The first nanowire segment 106a is deposited over the nucleation pad 104, about the second end 114 of the nucleation pad 104. The first nanowire segment 106a in one example is deposited about a center 116 of the nucleation pad 104. The first nanowire segment 106a is deposited about an axis A-A' that is substantially perpendicular to the plane B-B' of the nucleation pad 104. The first nanowire segment 106a includes a first end 202 and a second end 204. The first nanowire segment 106a is substantially made of a permalloy. In some examples, a suitable cobalt-nickel alloy or other similar materials that provide high magnetic permeability may be used. The first nanowire segment 106a in one example, is substantially cylindrical. The diameter of the first nanowire segment 106 may be about 80 nm to about 120 nanometer. A thickness of the first nanowire segment 106a may be of the order of about 400 nm to about 700 nm. In one example, the first nanowire segment 106a is deposited using Aluminum Oxide templates (AOT).

The second nanowire segment 106b is deposited over the first nanowire segment 106a, about the second end 202 of the first nanowire segment 106b. The second nanowire segment 106b in one example is deposited about the axis A-A' that is substantially perpendicular to the plane B-B' of the nucleation pad 104. The second nanowire segment 106b includes a first end 206 and a second end 208. The second nanowire segment 106b is substantially made of a permalloy. In some examples, a suitable cobalt-nickel alloy or other similar materials that provide high magnetic permeability may be used. The second nanowire segment 106b in one example, is substantially cylindrical. The diameter of the second nanowire segment 106 may be about nm to about 80 nanometer. A thickness of the second nanowire segment 106b may be of the order of about 400 nm to about 700 nm. In one example, the second nanowire segment 106a is deposited using Aluminum Oxide Template.

In one example, the coercivity of the first nanowire segment 106a and the coercivity of the second nanowire segment 106b will be different. For example, a diameter of the first nanowire segment 106a may be about 80 nm to about 120 nm and the diameter of the second nanowire segment 106b may be about 50 nm to about 80 nanometer. In one example, the difference in the diameter of the first nanowire segment 106a and the second nanowire segment 106b will yield different coercivity. In one example the different coercivity of the first nanowire segment 106a and the second nanowire segment 106b helps to better define the domain wall separation between the first nanowire segment 106a and the second nanowire segment 106b. The difference in coercivity may be of the order of about 40 milliTesla. In some examples, difference in coercivity may be achieved by selectively depositing alloys of Nickel-Cobalt with different coercivity for the first nanowire segment 106a and the second nanowire segment 106b. In other words, having a well defined domain walls between the first nanowire segment 106a and the second nanowire segment 106b may be achieved by either diameter modulation, as described above with different diameters or by using alloys which exhibit different coercivity.

Having described general construction of the memory device 100A, example operation of the memory device 100A will now be described with reference to FIGS. 3A, 3B, 3C, 3D, and 3E. Now, referring to FIG. 3A, the magnetic domain values P for first nanowire segment 106a and the second nanowire segment 106b are both 0. The magnetic domain value for the nucleation pad 104 is set to 1, by passing a charge current Isp pulse through the substrate 102. No shift current Ish pulse is flowing through the first nanowire segment 106a and the second nanowire segment 106b.

Figures 3A, 3B, 3C:
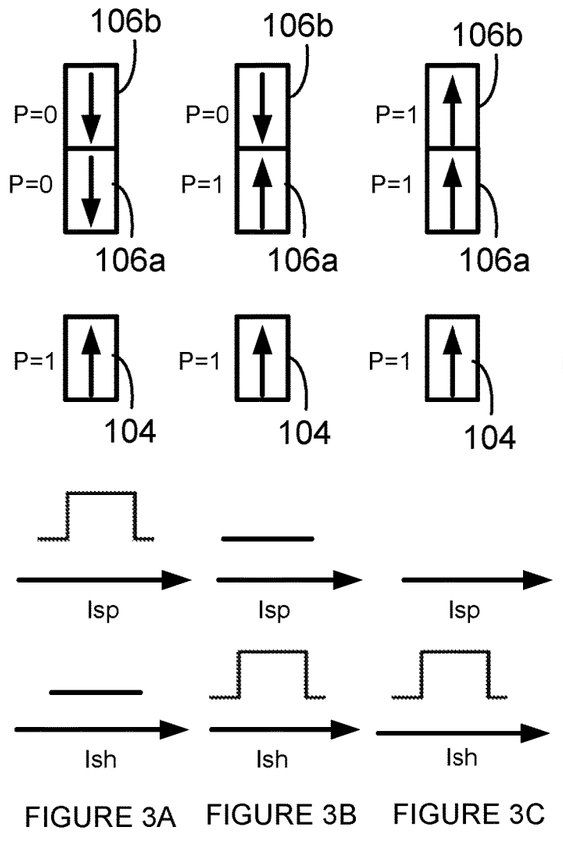
FIGS. 3A, 3B, 3C, 3D, and 3E show selective movement of the magnetic domain through a plurality of nanowire segments, according to one aspect of the present disclosure.

Next, referring to FIG. 3B, a shift current Ish is passed through the first nanowire segment 106a and the second nanowire segment 106b. As the magnetic domain value of the nucleation pad 104 is 1, the magnetic domain value of the first nanowire segment 106a is switched from a 0 to a 1. As previously described, this occurs due to the shifting of the domain wall from the nucleation pad 104 into the first nanowire segment 106a. The magnetic domain value of the second nanowire segment 106b remains at 0. Further, the magnetic domain value of the nucleation pad 104 remains at 1, as no charge current Isp was applied.

Now, referring to FIG. 3C, another shift current Ish is passed through the first nanowire segment 106a and the second nanowire segment 106b. As the magnetic domain value of the first nanowire segment 106a is 1, the magnetic domain value of the second nanowire segment 106b is switched from a 0 to a 1. In this example, the domain wall about the second end of the first nanowire segment 106a moves and shifts into the second nanowire segment 106b. Now, the magnetic domain value of the first nanowire segment 106a and the second nanowire segment 106b will become same, with a value of 1. Further, the magnetic domain value of the nucleation pad 104 remains at 1, as no charge current Isp pulse was applied.

Figure 3D:
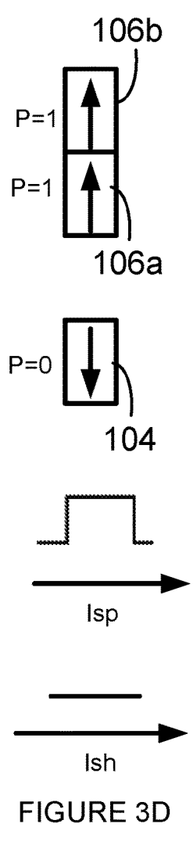

Now, referring to FIG. 3D, another charge current Isp pulse is applied to the substrate 102, and the magnetic domain value for the nucleation pad 104 switches to a 0. No shift current Ish pulse is flowing through the first nanowire segment 106a and the second nanowire segment 106b. So, there is no change in the magnetic domain values for first nanowire segment 106a and the second nanowire segment 106b.

Figure 3E:
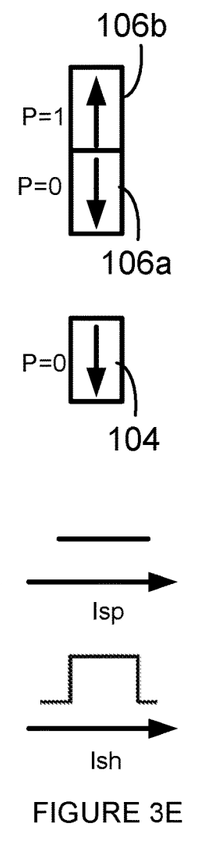

Now, referring to FIG. 3E, another shift current Ish pulse is passed through the first nanowire segment 106a and the second nanowire segment 106b. As the magnetic domain value of the nucleation pad 104 is 0, the magnetic domain value of the first nanowire segment 106a is switched from a 1 to a 0. As previously described, this occurs due to the shifting of the domain wall from the nucleation pad 104 into the first nanowire segment 106a. The magnetic domain value of the second nanowire segment 106b remains at 1.

Further, the magnetic domain value of the nucleation pad 104 remains at 0, as no charge current Isp was applied.

As one skilled in the art appreciates, by selectively passing a charge current Isp pulse through the substrate 102, the magnetic domain value of the nucleation pad 104 can be selectively switched between a 0 and a 1. Further, by selectively passing a shift current pulse Ish through the first nanowire segment 106a and the second nanowire segment 106b, the magnetic domain value may be selectively shifted from the nucleation pad 104 to the first nanowire segment 106a and from the first nanowire segment 106a to the second nanowire segment 106b. Further, the magnetic domain moves in a direction opposite to the direction of flow of the shift current pulse Ish. In some examples, by changing the direction of flow of the shift current pulse Ish, magnetic domain may be moved in the opposite direction, for example, from the second nanowire segment 106b to first nanowire segment 106a.

As previously described, the sensor 110 may be selectively placed in an operative position with respect to the first nanowire segment 106a and the second nanowire segment 106b to read the polarity of the magnetic domain, thereby read the value stored in the first nanowire segment 106a and the second nanowire segment 106b.

Figure 4:
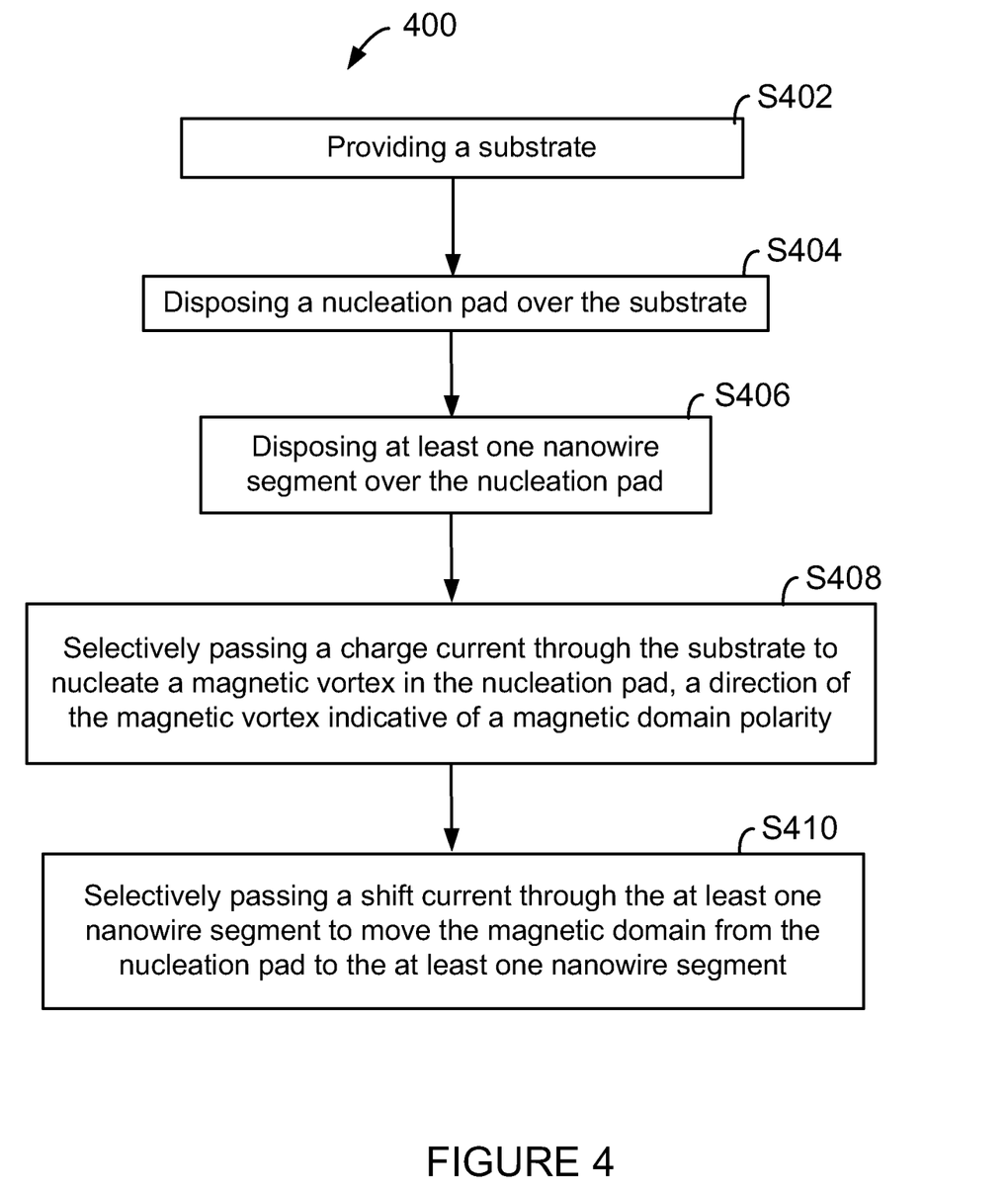
FIG. 4 shows an example flow diagram, according to one aspect of the present disclosure.

Now, referring to FIG. 4, an example flow diagram 400 is described. In block S402, a substrate is provided. For example, substrate 102 is provided.

In block S404, a nucleation pad is disposed over the substrate. For example, the nucleation pad 104 is disposed over the substrate 102.

In block S406, at least one nanowire segment is disposed over the nucleation pad. For example, the nanowire segment 106 is disposed over the nucleation pad 104.

In block S408, a charge current is selectively passed through the substrate to nucleate a magnetic vortex in the nucleation pad, a direction of the magnetic vortex indicative of a magnetic domain polarity. For example, a charge current Isp pulse is selectively passed through the substrate 102 to nucleate a magnetic vortex in the nucleation pad. The direction of the magnetic vortex is indicative of a magnetic domain polarity, as described with reference to FIGS. 1A and 1B.

In block S410, a shift current is selectively passed through the at least one nanowire segment to move the magnetic domain from the nucleation pad to the at least one nanowire segment. For example, a shift current Ish pulse is passed through the nanowire segment 106, as previously described with reference to FIG. 1. The magnetic domain polarity in the nanowire segment 106 changes based on the magnetic domain polarity of the nucleation pad 104, as previously described with reference to FIGS. 1C and 1D.

As one skilled in the art appreciates, example magnetic device 100 of FIG. 1 may be used as a single bit register or an inverter, to selectively switch the magnetic domain polarity of the nanowire segment 106 between a value of 0 and 1. Further, example magnetic device 100A of FIG. 2 may be advantageously used as a shift register, with each of the nanowire segments representing one position of a multi-bit shift register.

The foregoing description of the specific embodiments will so fully reveal the general nature of the embodiments herein that others can, by applying current knowledge, readily modify and/or adapt for various applications such specific embodiments without departing from the generic concept, and, therefore, such adaptations and modifications should and are intended to be comprehended within the meaning and range of equivalents of the disclosed embodiments. It is to be understood that phraseology or terminology employed herein is for the purpose of description and not of limitation.

While embodiments of the present invention are described above with respect to what is currently considered its preferred embodiments, it is to be understood that the invention is not limited to that described above. To the contrary, the invention is intended to cover various modifications and equivalent arrangements within the spirit and scope of the appended claims.

What is claimed is:

1. A method, including:
   providing a substrate;
   disposing a nucleation pad over the substrate;
   disposing a nanowire substantially perpendicular about a center of the nucleation pad;
   selectively passing a charge current pulse through the substrate to nucleate a magnetic vortex in the nucleation pad, magnetic vortex indicative of a magnetic domain and a direction of the magnetic vortex indicative of a polarity of the magnetic domain,
   wherein, the nanowire has a plurality of segments along an axis substantially perpendicular to the nucleation pad, adjacent segments having a different coercivity;
   selectively passing another shift current pulse through the nanowire to move the magnetic domain to an adjacent nanowire segment, along the axis of the nanowire.

2. The method of claim 1, further including,
   selectively passing one or more charge current pulses through the substrate to selectively switch the direction of the magnetic vortex; and
   selectively passing one or more shift current pulses through the nanowire to selectively move the magnetic domain to an adjacent nanowire segment, along the axis of the nanowire.

3. The method of claim 2, further including,
   selectively passing one or more shift current pulses along another direction, through the nanowire to selectively shift the magnetic domain from one nanowire segment to an adjacent nanowire segment, along the axis of the nanowire, in an another direction.

4. The method of claim 1, wherein, a diameter of the nucleation pad is of the order of about 300 nm to about 500 nm.

5. The method of claim 1, wherein a diameter of the nanowire adjacent the nucleation pad is of the order of about 80 nm to about 120 nm.

6. The method of claim 1, wherein a diameter of the segment of the nanowire ranges from about 50 nm to about 80 nm.

7. A system, including:
   a substrate;
   a nucleation pad disposed over the substrate;
   a nanowire disposed substantially perpendicular about a center of the nucleation pad;
   a charge current pulse is passed through the substrate to nucleate a magnetic vortex in the nucleation pad, a direction of the magnetic vortex indicative of a polarity of the magnetic domain,
   wherein, the nanowire has a plurality of segments along an axis substantially perpendicular to the nucleation pad, adjacent segments having a different coercivity,
   another shift current pulse is selectively passed through the nanowire, to move the magnetic domain to an adjacent nanowire segment, along the axis of the nanowire.

8. The system of claim 7, further including,
one or more charge current pulses are selectively passed through the substrate to selectively switch the direction of the magnetic vortex in the nucleation pad; and
one or more shift current pulses are selectively passed along the first direction, through the nanowire to selectively shift the magnetic domain to an adjacent nanowire segment, along the axis of the nanowire.

9. The system of claim 8, further including,
one or more shift current pulses are selectively passed along another direction, through the nanowire to selectively shift the magnetic domain to an adjacent nanowire segment, along the axis of the nanowire, in an another direction.

10. The system of claim 7, wherein, a diameter of the nucleation pad is of the order of about 300 nm to about 500 nm.

11. The system of claim 7, wherein a diameter of the nanowire adjacent the nucleation pad is of the order of about 80 nm to about 120 nm.

12. The system of claim 7, wherein a diameter of the segment of the nanowire ranges from about 50 nm to about 80 nm.

\* \* \* \* \*